United States Patent
Jeoung et al.

(10) Patent No.: US 9,754,551 B2
(45) Date of Patent: Sep. 5, 2017

(54) DISPLAY PANEL HAVING A NODE CONTROLLER FOR DISCHARGING NODES IN A SCAN DRIVER AND DRIVING METHOD THEREOF

(71) Applicant: LG Display Co., Ltd., Seoul (KR)

(72) Inventors: Hun Jeoung, Gyeonggi-do (KR);
Sanghee Yu, Gyeonggi-do (KR);
Sunghyun Cho, Seoul (KR); Bosun Lee, Chungcheongbuk-do (KR);
Byoungwoo Kim, Seoul (KR);
Sungwook Chang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/953,614

(22) Filed: Nov. 30, 2015

(65) Prior Publication Data
US 2016/0155409 A1 Jun. 2, 2016

(30) Foreign Application Priority Data

Dec. 2, 2014 (KR) .................. 10-2014-0170605

(51) Int. Cl.
| | |
|---|---|
| *G09G 3/36* | (2006.01) |
| *G09G 5/00* | (2006.01) |
| *G11C 19/28* | (2006.01) |

(52) U.S. Cl.
CPC .......... *G09G 5/003* (2013.01); *G09G 3/3677* (2013.01); *G09G 3/3696* (2013.01); *G11C 19/28* (2013.01);
(Continued)

(58) Field of Classification Search
CPC .................................................... G09G 5/003
(Continued)

(56) References Cited

U.S. PATENT DOCUMENTS

| | | | |
|---|---|---|---|
| 2010/0182305 A1 | 7/2010 | Fang et al. | |
| 2013/0038621 A1* | 2/2013 | Choi ................... | G09G 3/2092 |
| | | | 345/589 |

(Continued)

FOREIGN PATENT DOCUMENTS

| | | |
|---|---|---|
| EP | 2 509 077 A2 | 10/2012 |
| WO | 2013/137069 A1 | 9/2013 |
| WO | 2014/061574 A1 | 4/2014 |

OTHER PUBLICATIONS

Extended European Search Report dated Aug. 18, 2016, for corresponding European Patent Application No. 15196346.9.
(Continued)

*Primary Examiner* — Long D Pham
(74) *Attorney, Agent, or Firm* — Morgan, Lewis & Bockius LLP

(57) ABSTRACT

A display panel and a method of driving the same are disclosed. The display panel includes a shift register with a plurality of stages configured to shift and to output a scan pulse for a plurality of scan lines. Each stage includes a pull-up transistor and a pull-down transistor coupled in series and defining an output node therebetween, a driver with a first node coupled to a gate electrode of the pull-up transistor and a second node coupled to a gate electrode of the pull-down transistor; and a node controller coupled to the first node, the second node, and the output node. In each stage, the node controller is configured to selectively apply a reference voltage at the first node and the second node in response to a control signal.

19 Claims, 11 Drawing Sheets

(52) U.S. Cl.
CPC .............. *G09G 2310/0251* (2013.01); *G09G 2310/0267* (2013.01); *G09G 2310/0275* (2013.01); *G09G 2310/0286* (2013.01); *G09G 2310/0289* (2013.01); *G09G 2310/063* (2013.01); *G09G 2310/08* (2013.01); *G09G 2320/0257* (2013.01); *G09G 2330/027* (2013.01); *G09G 2330/04* (2013.01)

(58) Field of Classification Search
USPC .......................................................... 345/100
See application file for complete search history.

(56) References Cited

U.S. PATENT DOCUMENTS

| | | | |
|---|---|---|---|
| 2014/0037043 A1* | 2/2014 | Yoon .................... | G11C 19/287 377/64 |
| 2014/0111495 A1 | 4/2014 | Iwase | |
| 2014/0306948 A1 | 10/2014 | Iwamoto et al. | |
| 2014/0321599 A1* | 10/2014 | Cho ....................... | G11C 19/28 377/64 |
| 2015/0030116 A1 | 1/2015 | Horiuchi et al. | |
| 2015/0269900 A1 | 9/2015 | Iwamoto et al. | |

OTHER PUBLICATIONS

Partial European Search Report dated Apr. 15, 2016 for European Patent application No. 15196346.9.

\* cited by examiner

DISPLAY PANEL HAVING A NODE CONTROLLER FOR DISCHARGING NODES IN A SCAN DRIVER AND DRIVING METHOD THEREOF

CROSS REFERENCE TO RELATED APPLICATIONS

This application claims the benefit of Korean Patent Application No. 10-2014-0170605 filed on Dec. 2, 2014, the entire contents of which is incorporated herein by reference in its entirety.

FIELD

The present invention relates to a display panel and a method of driving the same.

BACKGROUND

The current development state of information technology emphasizes the use of display devices as a preferred medium for communicating information to user. Examples of display devices include flat panel displays, such as organic light emitting diode (OLED) displays and liquid crystal displays.

In general, display devices, such as flat panel displays, include a display panel including a plurality of pixels arranged in a matrix or array form and a driver for driving the pixels and other components of the display panel. In the case of color display panels, each pixel may be divided into red, green, and blue subpixels for the reproducing a range of colors. The driver may include a scan driver for supplying a scan pulse to the display panel and a data driver for supplying a data signal to the display panel.

The scan driver typically supplies the scan pulse to scan lines to progressively select each row of the subpixels of the display panel to operate, and the data driver typically supplies the data signal to data lines associated with each of the different columns of subpixels in the display panel. In operation, data signal is supplied for subpixels in the row selected by the scan pulse, and the selected subpixels emit light in response to the data signal. This process is repeated for all rows to cause the display panel to display an image.

In some configurations, the scan driver may shift the scan pulse from scan line to scan line using a shift register. For this purposes, a shift register may have a plurality of stages connected to the scan lines, where each stage is comprised of a plurality of transistors. Preferably, a stage has to stably maintain a voltage of the scan line connected to the stage. However, in some instances some of nodes inside the stage may be unbiased, and thus floating, during the operation of the scan driver. Due to this, these floating nodes are easily affected by external noise because no voltage supplied to these floating nodes. Unfortunately, these floating nodes may be affected by an external noise and thus may lead to several abnormal operations including changes in the voltage of the scan line, etc., which can cause abnormal operation for he the display panel.

Moreover, the lifespan of the transistors in the stages may be reduced because of a stress due to any charge remaining in the floating nodes. In certain configurations, such charges can persist for a significant period of time. In particular, because an off-current of a transistor using an oxide semiconductor is very low, it can take a relatively long time to naturally discharge any remaining charge at the gate of the transistor. Therefore, the transistor is stressed by these remaining charges.

SUMMARY

Accordingly, the present invention is directed to a display panel and a method of driving the same that substantially obviates one or more of the problems due to limitations and disadvantages of the related art An object of the present invention is to provide a display panel and a method of driving the same capable of stably driving a scan driver and increasing lifespan and reliability of transistors constituting the scan driver.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

One aspect of the present invention involves a display panel and a method of driving the same are disclosed. To achieve these and other advantages and in accordance with the purpose of the present invention, as embodied and broadly described, the display panel includes a shift register with a plurality of stages configured to shift and to output a scan pulse for a plurality of scan lines. Each stage includes a pull-up transistor and a pull-down transistor coupled in series and defining an output node therebetween, a driver with a first node coupled to a gate electrode of the pull-up transistor and a second node coupled to a gate electrode of the pull-down transistor; and a node controller coupled to the first node, the second node, and the output node. In each stage, the node controller is configured to selectively apply a reference voltage at the first node and the second node in response to a control signal.

In another aspect, a display device comprises a display panel having a plurality of scan lines, a timing controller, and a scan driver comprising a plurality of scan stages configured to generate scan line signals for each of the plurality of scan lines. Each of the plurality of scan stages includes a pull-transistor and a pull-down transistor coupled in series and defining an output node for a corresponding one of the plurality scan lines, a driver configured to generate driver control signals at a first gate electrode for the pull-up transistor and at a second gate electrode for the pull-down transistor, and a node controller configured to selectively couple and decouple a reference voltage node to the first gate electrode, the second gate electrode, and the output node according to a control signal from the timing controller.

In another aspect, a method of operating a display device comprises generating, at a timing controller, a control signal for a node controller configured to selectively couple and decouple a reference voltage node to a first gate electrode of a pull-up transistor of a scan driver stage, a second gate electrode of a pull-down transistor of the scan driver stage, and an output node of the scan driver stage. The generating involves, during a first time period, configuring the control signal for decoupling the reference voltage node from the first gate electrode, the second gate electrode, and the output node, and, during a second time period after the first time period, configuring the control signal for coupling the reference voltage node to the first gate electrode, the second gate electrode, and the output node.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the various aspects of the present disclosure and are incorporated in and constitute a part of the present disclosure, illustrate various aspects of the present disclosure and together with the description serve to explain the principles of the disclosure. In the drawings.

DETAILED DESCRIPTION OF THE ILLUSTRATED EMBODIMENTS

Figure 1:
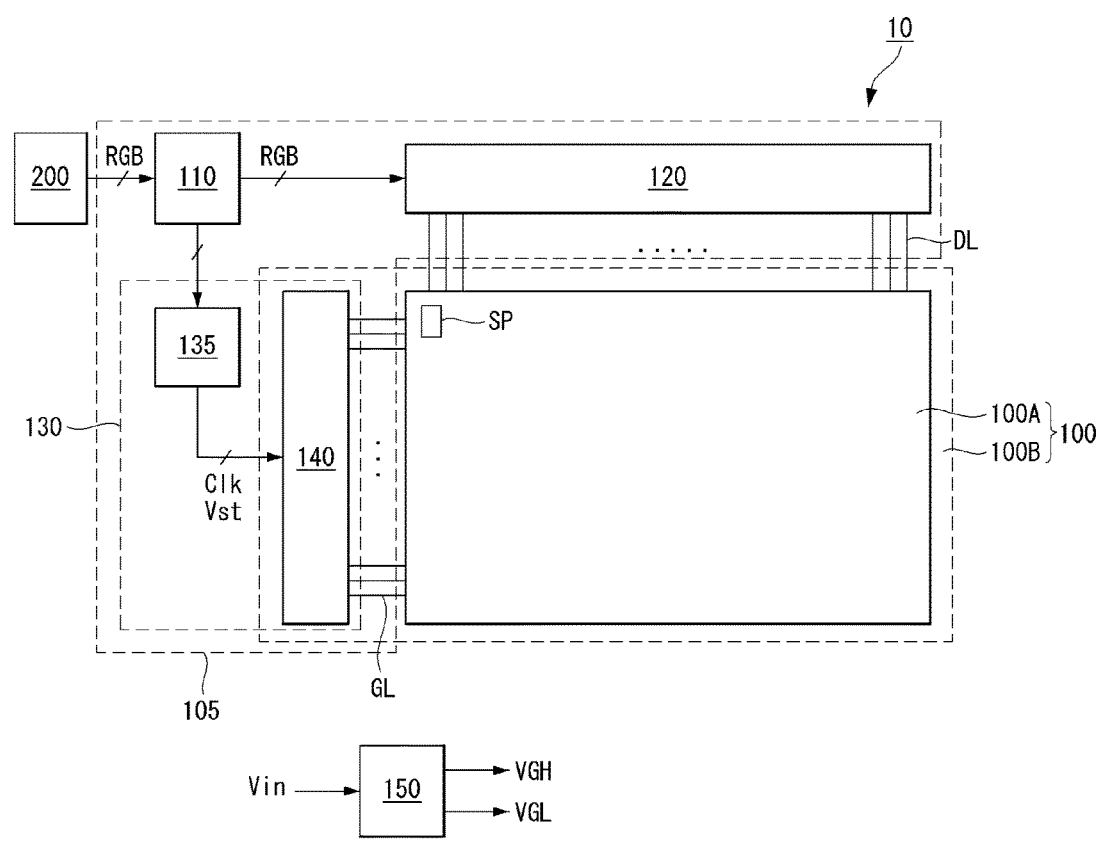
FIG. 1 is a block diagram showing a display device according to an one aspect of the present disclosure.

The various aspects of the present disclosure are described with reference to the attached figures, wherein like reference numerals are used throughout the figures to designate similar or equivalent elements. The figures are not drawn to scale and they are provided merely to illustrate the various aspects of the present disclosure. Several aspects of the present disclosure are described below with reference to example applications for illustration. It should be understood that numerous specific details, relationships, and methods are set forth to provide a full understanding of the various aspects of the present disclosure. One having ordinary skill in the relevant art, however, will readily recognize that the various aspects of the present disclosure can be practiced without one or more of the specific details or with other methods. In other instances, well-known structures or operations are not shown in detail to avoid obscuring the various aspects of the present disclosure. The various aspects of the present disclosure are not limited by the illustrated ordering of acts or events, as some acts may occur in different orders and/or concurrently with other acts or events. Furthermore, not all illustrated acts or events are required to implement a methodology in accordance with the various aspects of the present disclosure.

Referring to FIG. 1, there is shown a block diagram of a display device 10 according to an aspect of the present disclosure. As shown in FIG. 1, the display device 10 includes a display panel 100, a display panel driver 105, and a power unit 150. However, the present disclosure contemplates that display device 10 can include one or more other components not shown in FIG. 1.

The present disclosure contemplates that the display panel 100 may be implemented using various flat panel display technologies, including, but not limited to organic light emitting diode (OLED) display technologies, liquid crystal display (LCD) technologies, and electrophoresis display (EPD) technologies. The display panel 100 may be divided into a display area 100A, in which subpixels SP driven by signals applied from data lines DL and scan lines GL are formed, and a non-display area 100B, in which various signal lines or pads are formed. Each one of subpixels SP is configured to emit light in response to a data signal being supplied to ones of the data lines DL associated with the one of the subpixels SP concurrently with a scan pulse being supplied to and a row associated with one of the subpixels SP.

The display panel driver 105 includes a timing controller 110, a data driver 120, and a scan driver 130. The display panel driver 105 is configured for applying pixel data of an input image to pixels. However, the present disclosure contemplates that the display panel driver may include other components not shown in FIG. 1.

In operation, the timing controller 110 of the display panel driver 105 receives timing signals $t_H$ from an external host system 200. These can include, but are not limited to, a vertical sync signal, a horizontal sync signal, a data enable signal, and/or a dot clock signal Thereafter, the timing controller 110 generates timing control signals for controlling operation timing of the data driver 120 ($t_D$) and the scan driver 130 ($t_G$) based on the received timing signals $t_H$ to generate the data signals and scan pulses on data lines DL and scan lines GL, respectively, for producing an image using display panel 100.

The host system 200 may be implemented in a variety of ways. For example, the host system may be implemented as one of a television system, a set-top box, a navigation system, a DVD player, a Blu-ray player, a personal computer (PC), a home theater system, or a phone system, to name a few. In operation, the host system 200 obtains an input image from a video source and transmits the pixel data RGB of the input image to the timing controller 110. Additionally, the host system transmits the timing signals $t_H$ to the timing controller 110 so that they are synchronized with the pixel data RGB. Further, the host system 200 may rectify electric power from an external power or a battery, to generate an input voltage Vin. The input voltage Vin is then supplied to the power unit 150.

The data driver 120 of the display panel driver 105 operates by receiving video data RGB' and a data timing control signal $t_D$ from the timing controller 110. In certain aspects of the disclosure, pixel data RGB and video data RGB' may be the same. The data driver 120 receiving the video data RGB' may then convert the video data RGB' into a gamma compensation voltage in response to the data timing control signal $t_D$, generates the data signals corresponding to the video data RGB', and supplies the data signal to the data lines DL. For this, the data driver 120 may include a plurality of source driver integrated circuits (ICs). The source driver ICs may be connected to the data lines DL through a chip-on-glass (COG) process or a tape automated bonding (TAB) process.

The scan driver 130 may include a level shifter 135 and a shift register 140. In operation, the level shifter 135 shifts voltage levels of various signals, including clock signals CLKx and at least one start signal Vst received from the timing controller 110. and supplies the various signals to the shift register 140.

The signal input to the level shifter 135 may be a signal of a transistor-transistor logic (TTL) level swinging between 0V and 3.3V. The level shifter 135 shifts an input signal voltage and converts the input signal voltage into a signal of a voltage swinging between a gate low voltage VGL and a gate high voltage VGH. The gate low voltage VGL may be set to a voltage less than a threshold voltage of a transistor, for example, −10V as shown below with respect to FIGS. 10 and 11. The gate high voltage VGH may be set to a voltage equal to or greater than the threshold voltage of the transistor, for example, +20V as also shown below with respect to FIGS. 10 and 11. For purposes of specifying VGL and VGH, the "transistor" may refer to a transistor constituting the shift register 140 and/or a transistor inside the pixel. The transistor of the shift register 140 and the transistor of the pixel may be simultaneously formed on a substrate of the display panel 100 through the same manufacturing process.

The shift register 140 may include a plurality of stages, each of which shifts and outputs a scan pulse in response to the clock signals CLKx and the start signal Vst. Each stage is connected to at least one of the scan lines GL and outputs the scan pulse to the one of the scan lines GL. In some aspects, the shift register 140 may be formed in the non-display area 100B of the display panel 100 through a gate-in panel (GIP) process. In some aspects, the level shifter 135 may be mounted on an external substrate connected to the display panel 100 in the form of integrated circuit (IC) or may be mounted in the non-display area 100B of the display panel 100.

The power unit 150 is configured for receiving the input voltage Vin from the host system 200 and generating the driving voltage required to drive the display panel drivers 110, 120, 130 and the display panel 100. In operation, the power unit 150 adjusts the input voltage Vin and generates driving voltages at various levels. In certain aspects, the power unit 150 can use a DC-DC converter, a charge pump, a regulator, or the like to adjust the input voltage Vin. In some aspects, the power unit 150 may be integrated with a power IC chip. The driving voltages provided by the power unit 150 can be configured to provide driving voltages for the display panel driver, a gamma reference voltage supplied to the data driver 120, the gate high voltage VGH, the gate low voltage VGL, and a common voltage Vcom of the LCD or a pixel driving voltage ELVDD of the OLED display, depending on the display panel technology being utilized. However, the present disclosure also contemplates that the power unit can be configured to generate other driving voltages, depending on the configuration of display device 10.

In some aspects, the display device 10 can include a power switch that may be turned off due to a user's operation or other reasons. Alternatively, the display device 10 can rely on an external power source or a battery. However, in the case where power is cut off, regardless of the source, the present disclosure contemplates that the power unit 150 can detect a discharge of the input voltage Vin and automatically discharge any driving voltages based on the previously set power-off sequence.

Figure 2:
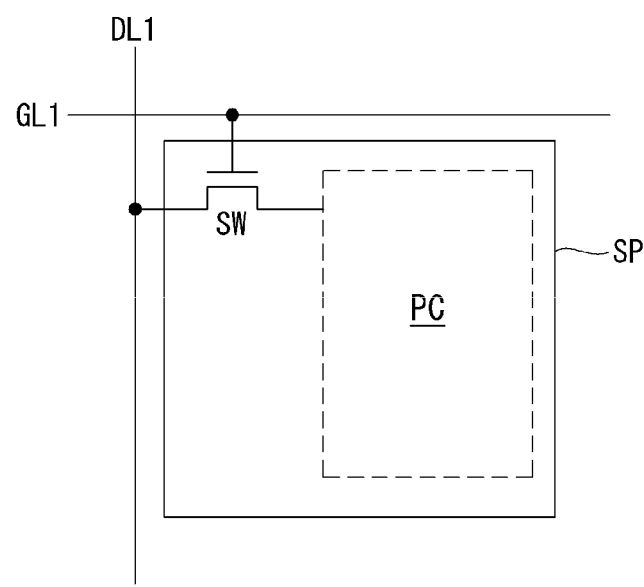
FIG. 2 is a circuit diagram showing an example of a configuration of a subpixel in the display device shown in FIG. 1.

Now turning to FIG. 2, there is shown an exemplary configuration of a subpixel SP according to an aspect of the present disclosure. As shown in FIG. 2, a subpixel SP may be connected to a first scan line GL1 and a first data line DL1. In particular, the subpixel SP may include, as shown in FIG. 2, a switching transistor SW with a gate node connected to the first scan line GL1, a source node connected to the first data line DL1, and a drain node connected to a pixel circuit PC. In operation, the pixel circuit PC is driven in response to the data signal supplied by first data line DL1 through the switching transistor SW when an appropriate signal is provided by first scan line GL1.

The subpixel SP can be implemented in a variety of ways. For example, the subpixel SP can be implemented as a liquid crystal display panel including a liquid crystal element or an OLED display panel including an organic light emitting element. However, the particular configuration of the pixel circuit PC can vary depending on the type of display device technology being used.

When the subpixels SP of the display panel 100 are implemented as liquid crystal elements, the display panel 100 may be implemented in several modes for adjusting an angle of a liquid crystal and adjusting the light emission. Example of such modes include, but are not limited to: a twisted nematic (TN) mode, a vertical alignment (VA) mode, an in-plane switching (IPS) mode, a fringe field switching (FFS) mode, or an electrically controlled birefringence (ECB) mode. When the subpixels SP of the display panel 100 are implemented as the organic light emitting element, the display panel 100 may be implemented as a top-emission display panel, a bottom-emission display panel, or a dual-emission display panel, to name a few. However, the present disclosure contemplates that the subpixels are not limited to the technologies or modes listed above.

Figure 3:
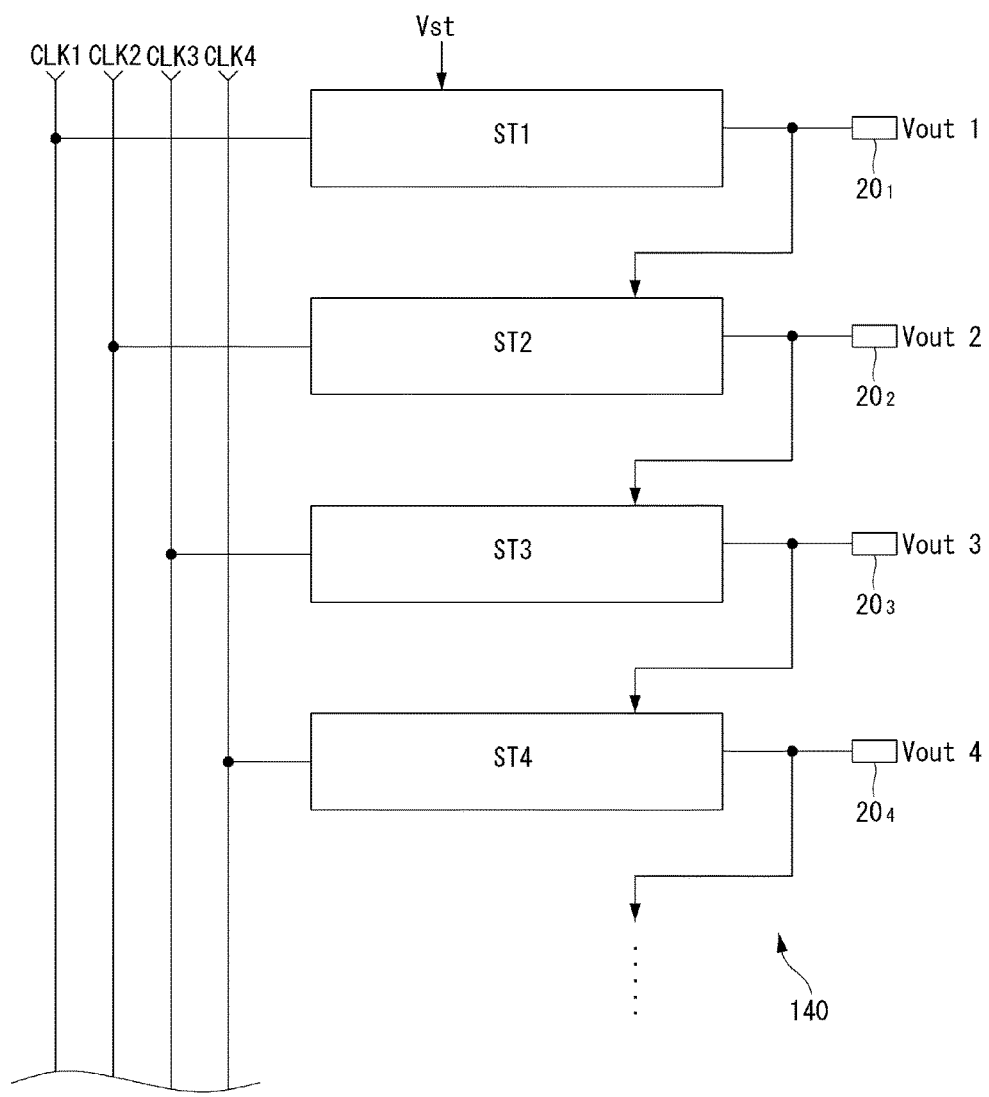
FIG. 3 shows an example of a configuration of a shift register of a scan driver shown in FIG. 1.
Figure 4:
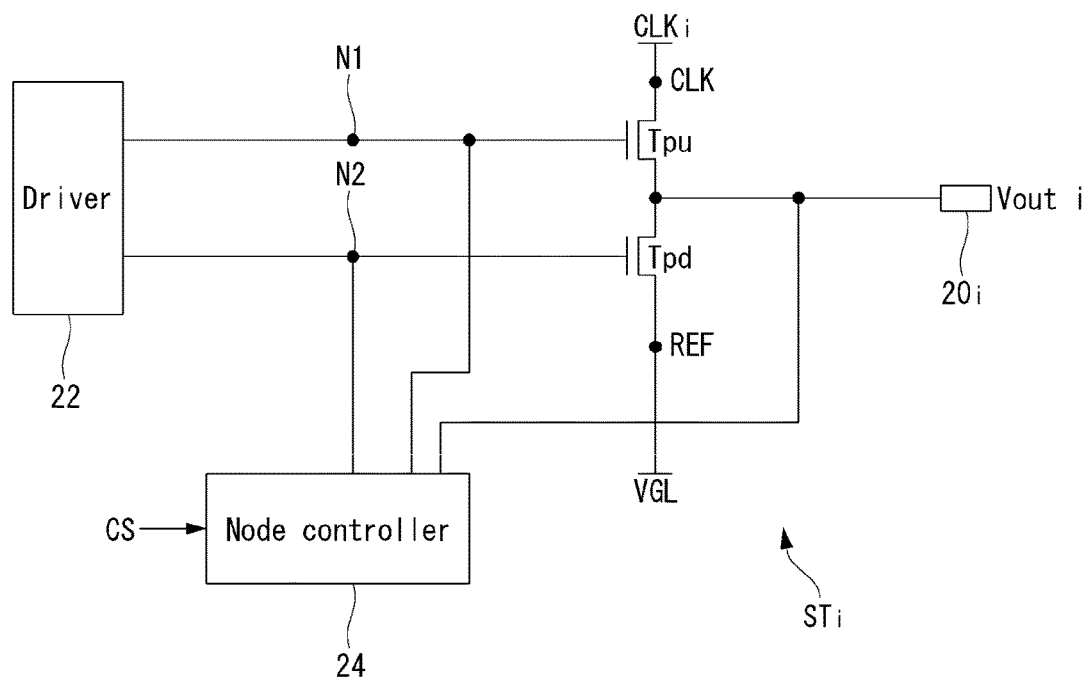
FIG. 4 shows an example of a configuration of a stage shown in FIG. 3.

Now turning to FIG. 3, there is shown an exemplary configuration for the shift register 140 of the scan driver 130. FIG. 4 shows an exemplary a configuration of a stage of the shift register 140 shown in FIG. 3.

As shown in FIG. 3, the shift register 140 includes a plurality of stages STi (I=1, 2, . . . N), such as stages ST1 to ST4. The stages STi output the scan pulse through an corresponding output terminal 20$i$, such as output terminals 20$_1$ to 20$_4$ corresponding to stages ST1 to ST4, while shifting the start signal Vst in response to at least one clock signal CLKi, such as clock signals CLK1 to CLK4 corresponding to stages ST1 to ST4.

Although FIG. 3 shows discrete stages ST1 to ST4 in the shift register 140, each associated with discrete, corresponding clock signals CLK1 to CLK4, the various aspects of the present disclosure are not limited to the arrangement illustrated in FIG. 3. The present disclosure contemplates, the stages may be implanted using various circuit designs to achieve the same effect and may include more or less clock signals depending on the circuit configuration. Hence, each of stages STi may receive as an input, in some aspects, various signals.

Now turning to FIG. 4, each of the stages STi may include a pull-up transistor Tpu, a pull-down transistor Tpd, a driver 22, and a node controller 24. The pull-up transistor Tpu is connected, via source and drain nodes or electrodes, between a clock node CLK and the output terminal 20$i$. The clock signal CLKi for stage STi is supplied to the pull-up transistor Tpu at the clock node. A gate node or electrode of the pull-up transistor Tpu is connected to a first node N1 (i.e., a Q node). The pull-up transistor Tpu supplies the gate high voltage VGH to the output terminal 20$i$ in response to a voltage at the first node N1.

In operation, the clock signal CLKi swings between the gate high voltage VGH and the gate low voltage VGL. The gate high voltage VGH or a voltage equal to or greater than the gate high voltage VGH may be supplied to the clock line in a process for performing the power-off sequence, which will be described in detail later. Because a voltage of the clock signal CLKi does not swing and is discharged from the gate high voltage VGH in the power-off sequence, the gate high voltage VGH may be temporarily supplied at the clock node in the power-off sequence shown in FIGS. 10 and 11.

The pull-down transistor Tpd is connected, via source and drain nodes or electrodes, between the output terminal 20*i* and a reference node REF. The gate low voltage VGL or a VSS voltage is supplied to the pull-down transistor Tpd at the reference node REF. A gate node or electrode of the pull-down transistor Tpd is connected to a second node N2 (i.e., a QB node). The pull-down transistor Tpd supplies the gate low voltage VGL to the output terminal 20 in response to a voltage of the second node N2.

The driver 22 controls the voltages at the first node N1 and the second node N2 in response to signals supplied through one or more signal lines (not shown). The driver 22 may thus alternately turn on and off the pull-up transistor Tpu and the pull-down transistor Tpd by controlling the voltages of the first node N1 and the second node N2.

Separately from the driver 22, a node controller 24 also controls the voltages at the first node N1, the second node N2, and the output terminal 20*i*. For example, the node controller 24 may supply a predetermined voltage, for example, the gate low voltage VGL to the first node N1, the second node N2, and the output terminal 20*i* in response to a control signal CS. The control signal CS is generated by the timing controller 110, and a voltage of the control signal CS may be properly shifted by the level shifter 135.

When the gate low voltage VGL is supplied to the first node N1 and the second node N2, the pull-up transistor Tpu and the pull-down transistor Tpd are switched to a turn-off state and stably maintain the turn-off state. When the gate low voltage VGL is supplied to the output terminal 20*i*, the voltage of the output terminal 20*i* is maintained at the gate low voltage VGL. As a result, charges remaining on the first node N1, the second node N2, the output terminal 20*i*, and the scan line connected to the output terminal 20*i* are discharged. Operation of the node controller 24 is described in detail below with reference to a driving waveform.

Figure 5:
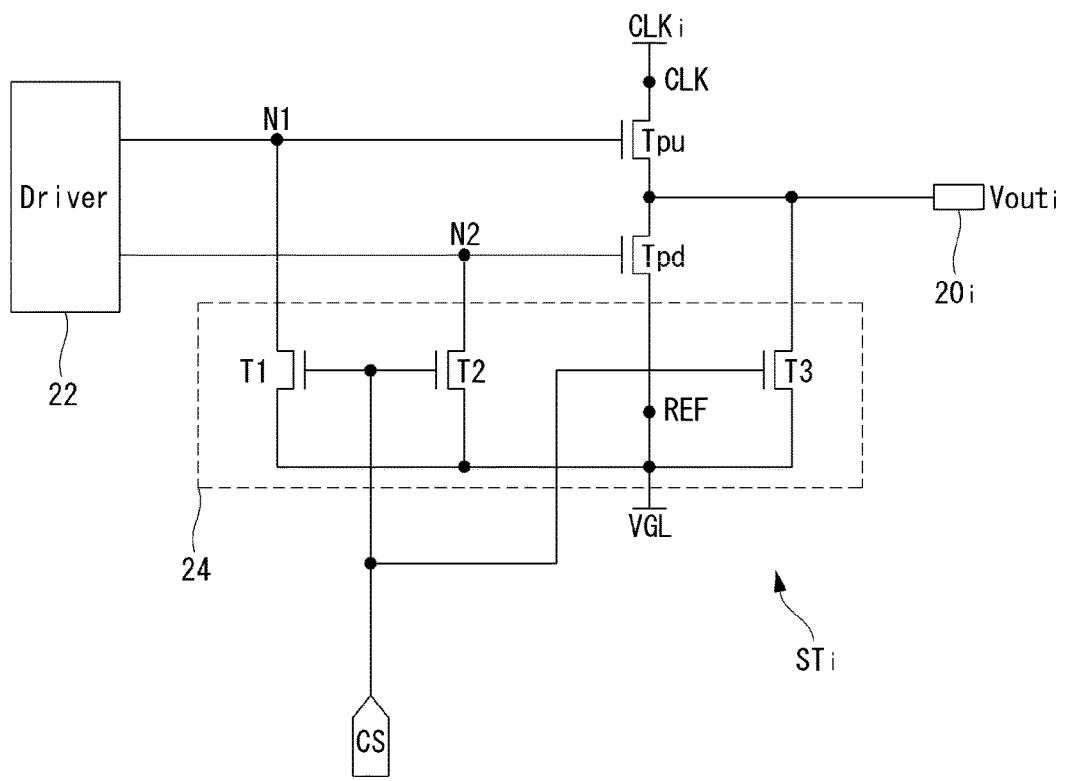
FIG. 5 is a circuit diagram showing in detail a node controller shown in FIG. 4.

Now turning to FIG. 5, an exemplary configuration for the node controller 24 is shown. As noted above, the node controller 24 forces the floating nodes, or otherwise floatable nodes, to be at a certain specific potential. In other words, the nodes, which would have been floating during a certain period (e.g., an OFF period of FIG. 6) when the scan pulse is not applied, are actively supplied with the gate low voltage VGL or other reference voltage. In this way, the voltage on those floatable nodes (e.g., the first node N1, the second node N2, the output terminal 20*i*) and the scan line can be stabilized to a certain potential with minimal noises. In this disclosure, the first node N1, the second node N2 and the output terminal 20*i* are provided as examples of the floatable nodes in the stages. However, it should be appreciated that the floatable nodes in the stages are not limited to the nodes mentioned above. The floatable nodes may include nodes between transistors, which can be maintained in a turn-off state at the same time during the operation of the display driver 105.

As noted above, the node controller 24 includes transistors connected to the floatable nodes (e.g., the first node N1, the second node N2) and the output terminal of the stages. During the power off sequence of the display device, the node controller 24 may be configured to maintain a turn-on state of its transistors (e.g., T1, T2 and T3) for a longer period of time than other transistors used in implementing the stages. The transistors of node controller 24 may be designed in the same structure as other transistors, and controlled by control signal CS. The delay in putting the transistors of the node controller 24 in a turn-off state is intended to secure the time for discharging the nodes inside the stage, the output terminal of the stage and the scan line connected to the output terminal. Since the nodes of the stages are more thoroughly discharged, the transistors connected to those nodes are less likely to be stressed by the charges remaining in the nodes. Thus the lifespan and the reliability of the display device can be improved. For example, as the methods described herein result in the removal remaining charges when the supply of the power is stopped, the lifespan of devices stressed by such charges can be improved.

As shown in FIG. 5, the exemplary configuration for the node controller 24 includes first, second, and third transistors T1, T2, and T3. The first transistor T1 is connected between node N1 and the reference node REF in order to provide a discharge path for the first node N1 in response to the control signal CS provided at the gate node or electrode of first transistor T1. In particular, when the control signal CS is supplied at the gate node of the first transistor T1, the first transistor T1 is turned on, connecting node N1 and reference node REF. Thus, the gate low voltage VGL from the power unit 150 is applied at the first node N1, discharging any excess charges at first node N1.

Similarly, the second transistor T2 is configured for discharging the second node N2 in response to the control signal CS. That is, second transistor T2 is connected between second node N2 and the reference node REF in order to provide a discharge path for the second node N2 in response to the control signal CS provided at the gate node or electrode of second transistor T2. In particular, when the control signal CS is supplied to a gate node of the second transistor T2, the second transistor T2 is turned on, connecting node N2 to reference node REF. Thus, the gate low voltage VGL is applied at the second node N2, discharging any excess charges at second node N2.

Also similar to the first transistor T1 and the second transistor T2, the third transistor T3 is configured for discharging the output terminal 20*i* in response to the control signal CS. That is, the third transistor T3 is connected between the output terminal 20*i* and the reference node REF in order to provide a discharge path for the output terminal 20*i* in response to the control signal CS provided at the gate node or electrode of third transistor T3. In particular, when the control signal CS is supplied to a gate node of the third transistor T3, the third transistor T3 is turned on, connecting output terminal 20*i* to reference node REF. Thus, the gate low voltage VGL is applied at the output terminal 20*i*, discharging any excess charges at the output terminal 20*i*.

The voltage of the control signal CS may be set to the gate low voltage VGL, the gate high voltage VGH, a voltage equal to or greater than the gate high voltage VGH, or a voltage between the gate low voltage VGL and the gate high voltage VGH depending on a driving process. That is, depending on the types of transistors used for transistors T1-T3.

The present disclosure contemplates that the configuration of the node controller 24 is not limited to the arrangement shown in FIG. 5. For example, the node controller 24 may further include additional transistors, as discussed in further detail before with respect to FIG. 12, for discharging any nodes capable of operating as a floating node in the driver 22 or elsewhere in stage STi.

In view of the foregoing, the present disclosure contemplates a method for discharging floating nodes that involves maintaining the transistors of the node controller 24 in the turn-on state for a longer period of time than other transistors of the stage STi during the power-off sequence by increasing an On-period of the transistors through the control signal CS. However, the various aspects of the present disclosure are not limited thereto. For example, as shown in greater detail below with respect to FIGS. 10 and 11, there are various methods including a method for increasing a time constant of the voltage of the control signal CS, a method for delaying the voltage of the control signal CS, and the like.

Figure 6:
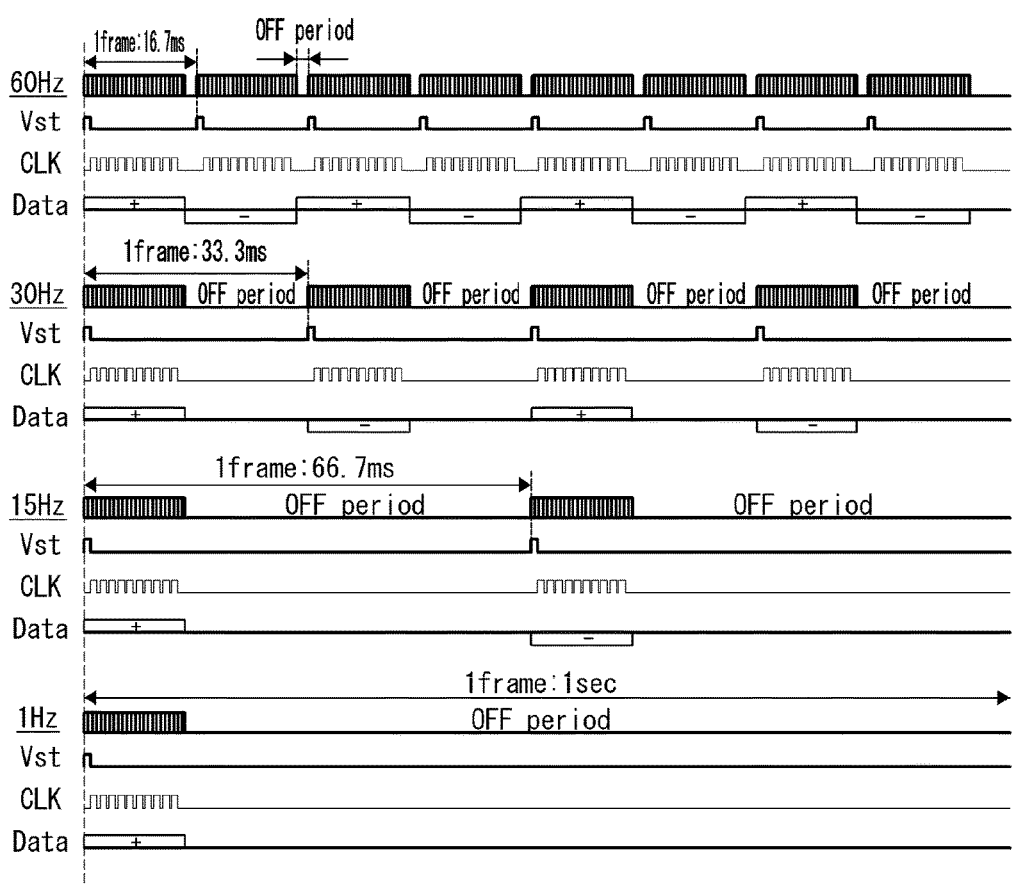
FIGS. 6 and 7 are waveform diagrams showing an example of a method of driving a display device according to one aspect of the present disclosure.
Figure 7:
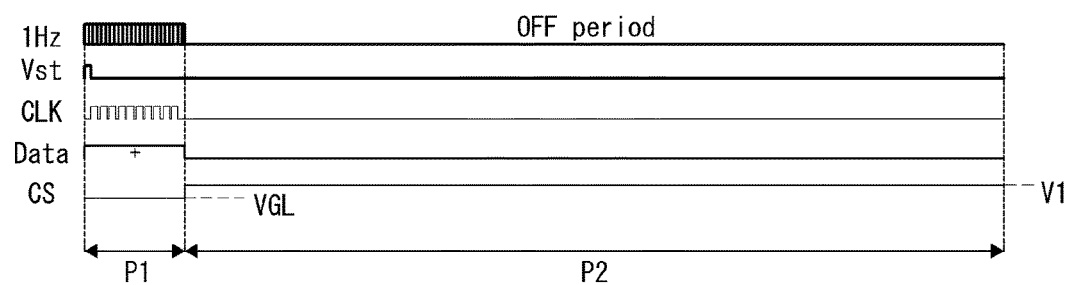

Now turning to FIGS. 6 and 7, there are shown are waveform diagrams illustrating an exemplary method for driving a display device according to an aspect of the present disclosure.

Referring first to FIG. 6, there are shown waveforms for different frame rates. In particular, an update cycle of data applied to the pixels of the display panel 100 can vary depending on a frame rate. That is, the scan driver 130 may adjust the number of scan pulses supplied to the display panel 100 under the control of the timing controller 110. In some configurations, the number of scan pulses can be based on the type of image being presented. For example, when a motion image is displayed on the display panel 100 (e.g., video or other images with a high amount of motion or change), the scan driver 130 may supply the scan pulse based on a previously set frame rate. In contrast, when a stop image is displayed on the display panel 100 (e.g., still images or other images with a low amount of motion or change), the scan driver 130 may supply the scan pulse based on a lower frame rate.

In one particular configuration, when a motion image is displayed on the display panel 100, the scan driver 130 may supply the 60 scan pulses per second to each scan line to provide a frame rate of 60 Hz. In contrast, when a stop image is displayed on the display panel 100, the scan driver 130 may supply one scan pulse per second to each scan line to provide a frame rate of 1 Hz. Thus, the present disclosure contemplates that the scan driver 130 may adjust the number of scan pulses supplied to each scan line to provide different frame rates (for example, 30 Hz, 15 Hz, 120 Hz, etc.) based on temporal changes in the input image. These changes in frame rate can be provided by control of the timing controller 110.

In view of the foregoing, the present disclosure contemplates that a scan period (or an address period), in which the scan pulse is supplied to each scan line, herein referred to as a first period P1, and a period in which the scan pulse is not supplied to each scan line, herein referred to as a second period P2, are provided. The second period P2 may include a blank time, in which the scan pulse is not supplied between respective frame periods displaying the image on the display panel 100.

In FIGS. 6 and 7, the "OFF period" indicates this second period P2. Thus, the frame period in FIGS. 6 and 7 are defined by a first period P1, during which the scan pulse is supplied, and a second period P2, during which the scan pulse is not supplied. For example, when the scan driver 130 is driven at the frame rate of 1 Hz, as shown in FIG. 7, a period from about 59/60 second is set to the second period P2.

When the first node N1 and the second node N2 are set in a floating state during the second period P2, there is a possibility that the voltage of the output terminal 20i may be changed by external noise. That is, the noise can change a charge, and thus a voltage, at either of nodes N1 and N2, causing the state of either of transistors Tpu or Tpd to change. In the event of such changes, the voltage at output terminal 20i may also change. Thus, in some embodiments of the present disclosure, the voltages of the first node N1, the second node N2, and the output terminal 20i are controlled by the node controller 24 so that the voltage of the output terminal 20i is discharged or otherwise stabilized during the second period P2.

Therefore, the stage STi operates as follows. During the first period P1, during which the scan pulse is supplied to the output terminal 20i, the control signal CS is set to a voltage (e.g., a gate low voltage VGL) that turns off the first, the second and the third transistors T1~T3 of the node controller 24. As such, the voltages of the first node N1 and the second node N2 are controlled by the driver 22. That is, during the first period P1, the pull-up transistor Tpu and the pull-down transistor Tpd of the stage STi operate normally according to the operation of the driver 22, and the scan pulse is supplied to the output terminal 20i without any significant concerns about noise affecting nodes N1 and N2.

During the second period P2 during which the scan pulse is not to be supplied at the output terminal 20i, the control signal CS is set to a first on-voltage V1 for turning on the first, the second and the third transistors T1~T3 of the node controller 24. During the second period P2, the driver 22 may or may not apply a specific voltage to the first node N1 and the second node N2. In either case, the voltage at the reference node REF is supplied to the first node N1 and the second node N2 as the transistors of the node controller 24 are turned on. As such, the first node N1 and the second node N2 are prevented from being in the floating state.

The first on-voltage V1 can be any voltage between the gate low voltage VGL and the gate high voltage VGH provided to the stage STi, so long as the first on-voltage V1 is sufficient to switch on the transistors included in the node controller 24 (e.g., T1~T3). When the first to third transistors T1 to T3 of the node controller 24 are turned on, the gate low voltage VGL is supplied to the first node N1, the second node N2, and the output terminal 20. Because the gate low voltage VGL is supplied to the first node N1 and the second node N2, the first node N1 and the second node N2 are not in the floating state, and the pull-up transistor Tpu and the pull-down transistor Tpd are stably maintained in an off state. Further, because the gate low voltage VGL is supplied to the output terminal 20 through the third transistor T3 in the same manner as the first node N1 and the second node N2, the voltage of the output terminal 20 may be stably maintained at the gate low voltage VGL.

Using the separate node controller 24 and the control signal CS allows to actively supply gate low voltage VGL on the first node N1 and the second node N2 during the second period P2, and this makes it easy to maintain the pull-up transistor Tpu and the pull-down transistor Tpd to the off state even if the external noise is present. Therefore, reliability of the scan driver 130 may be secured.

As is apparent from the foregoing, the voltage of the output terminal 20i is maintained at the gate low voltage VGL differently in periods P1 and P2. In particular, the pull-down transistor Tpd is used in the first period P1 and the third transistor T3 is used in the second period P2. Because of this reduced use of pull-down transistor Tpd, this configuration may further reduce a gate bias stress of the pull-down transistor Tpd and may improve the lifespan and the reliability of the scan driver 130 as compared to a conventional scan driver relying on a same pull-down transistor during both the first period P1 and the second period P2.

The present disclosure also contemplates that when the first on-voltage V1 used as the control signal CS during the second period P2 is set to a voltage between the gate low voltage VGL and the gate high voltage VGH. In this way, the gate bias stress of the transistors of the node controller 24 can be reduced, which in turn, reduces the changes in a threshold voltage Vth of the transistors. Hence, the reliability of the scan driver 130 may be further secured in the process of the power-off sequence.

More specifically, when the transistors T1, T2, and T3 included in the node controller 24 are continuously driven, the threshold voltage Vth of each transistor is shifted in response to a gate-to-source voltage Vgs (Vg–Vs) and a voltage application time, and operation characteristics of each transistor change. However, the threshold voltage Vth of the transistor (T1~T3) will not be shifted beyond the gate-to-source voltage Vgs.

This embodiment of the invention prevents the threshold voltage of the transistors T1, T2, and T3, included in the node controller 24, from being greater than a voltage (i.e., the first on-voltage V1) applied during the second period P2 through the first voltage V1 between the gate low voltage VGL and the gate high voltage VGH used as the control signal CS applied during the second period P2.

In some embodiments of the disclosure, different voltages can be used for control signal CS during the second period P2 and during the power off sequence of the display device. As noted above, the first on-voltage V1 of the control signal CS applied during the second period P2 can be a voltage between the gate low voltage VGL and the gate high voltage VGH. As such, the threshold voltage of the transistors T1, T2 and T3 included in the node controller 24 cannot be shifted beyond the gate-to-source voltage Vgs applied during the second period P2. When a gate voltage of the transistors is high in a long time, a threthold voltage of the transistors is shifted due to a DC gate bias stress. Because of this, a voltage of the control signal CS supplied to a gate of the transistors during P2 is lower than VGH, leakage current is flowed in the TFT to discharge the floating nodes when the control signal CS is set between VGH and VGL.

For example, when the control signal CS is 0V and the gate low voltage VGL is set to −10V, the threshold voltage of the transistors T1, T2 and T3 included in the node controller 24 may not be shifted to a voltage exceeding 10V. Accordingly, during the power-off sequence of the display device, the voltage of the control signal CS is set to a voltage greater than the first on-voltage V1 used as the control signal CS during the second period P2. For example, the voltage of the control signal CS may use the gate high voltage VGH or a voltage greater than the gate high voltage VGH in the process of the power-off sequence. In this way, it can be ensured that the transistors T1, T2 and T3 of the node controller 24 are turned on by the control signal CS during the power-off sequence of the display device.

Figure 8:
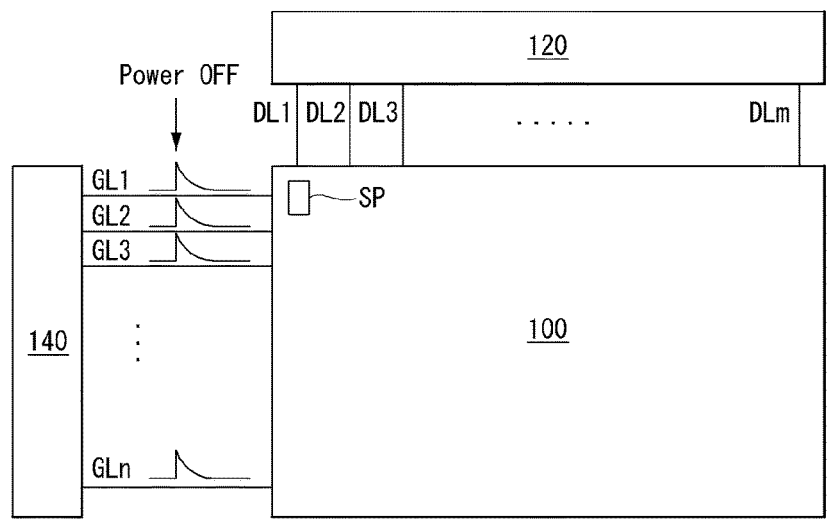
FIG. 8 is a waveform diagram showing an output voltage of a shift register of a scan driver in a power-off sequence process of the display device shown in FIG. 1.

FIG. 8 depicts a waveform diagram that illustrates an output voltage of the shift register of the scan driver in the process of the power-off sequence of the display device depicted in FIG. 1.

As depicted in FIG. 8, when the supply of power to the display device is stopped, the gate high voltage VGH is temporarily supplied to the signal lines connected to the shift register 140 of the scan driver and then is discharged in the process of the power-off sequence. As a result, the transistors inside the shift register 140 and thin film transistors (TFTs) of the pixels connected to the scan lines GL1 to GLn are temporarily turned on, and any remaining charge is discharged.

More specifically, when the supply of power is stopped, the gate high voltage VGH is temporarily supplied to external signal lines connected to the shift register 140 in the process of the power-off sequence. For example, the gate high voltage VGH may be both temporarily and simultaneously supplied to the signal lines including the low potential power line supplying the gate low voltage VGL to the shift register 140, the clock line supplying the clock CLK, a high potential power line supplying the gate high voltage VGH, a control signal line supplying the control signal CS, etc. In addition, if a separate signal line for driving the driver 22 is present, the gate high voltage VGH may be supplied to the separate signal line at the same time as the above signal lines.

The gate high voltage VGH is the voltage at which the transistors of the shift register 140 are turned on. Therefore, when the gate high voltage VGH is applied to the signal lines connected to the shift register 140, the transistors included in the shift register 140 are turned on.

As depicted in FIG. 8, when the gate high voltage VGH is supplied to all of the signal lines as described above, the gate high voltage VGH is simultaneously output to all of the scan lines GL1 to GLn and turns on a switching transistor (e.g., a TFT) of each subpixel SP. In this example, the data driver 120 supplies a black data signal or a ground level voltage GND to the data lines DL1 to DLm and initializes the subpixels SP in a predetermined state. Afterwards, the supply of the gate high voltage VGH to the signal lines connected to the shift register 140 is cut off, and a natural discharge of the voltage of the signal lines and a natural discharge of any remaining charge on the shift register 140 is induced.

An embodiment of the invention may delay a discharge of a signal line (hereinafter, referred to as "control signal supply line"), to which the control signal CS is supplied, so that the remaining charge on the control signal supply line is discharged more slowly than other signal lines. Hence, the transistors (e.g., the transistors driven by the control signal supply line) included in the node controller 24 may maintain the turn-on state for a longer period of time than other transistors.

Figure 9:
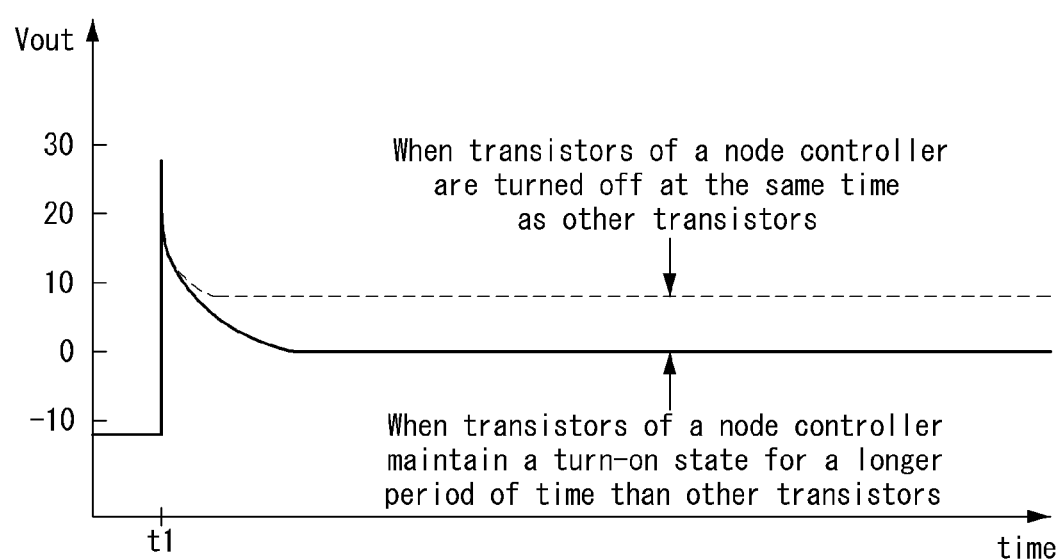
FIG. 9 is a waveform diagram showing an output voltage of a scan driver varying depending on whether a control signal of a node controller is absent or present.

FIG. 9 depicts a waveform diagram illustrating an output voltage of the scan driver that varies depending on whether the control signal of the node controller is absent or present.

As depicted in FIG. 9, when the turn-on state of the transistors of the shift register 140 driven through the control signal supply line is not maintained for a longer period of time than other transistors of the shift register 140, any remaining charge is not completely discharged after the power off. As depicted in FIG. 9, "t1" is a power-off sequence start time. In this instance, because voltages of drain electrodes and source electrodes of the pull-up and pull-down transistors Tpu and Tpd, a voltage of the first node N1, and a voltage of the second node N2 simultaneously fall, charge remains on the first node N1 and the second node N2. The remaining charge may lead to the degradation of the transistor. In particular, if the transistor is implemented as an oxide semiconductor transistor having a low Off-current, any remaining charge on the nodes N1 and N2 may not be naturally discharged and may remain for a long period of time. Therefore, the pull-up and pull-down transistors Tpu and Tpd may operate under a great deal of stress.

When the control signal supply line is connected to the shift register 140 according to an embodiment of the invention and controls the node controller 24, the transistors T1, T2, and T3 of the node controller 24 can maintain the turn-on state for a longer period of time than other transistors. Therefore, any remaining charge on each of the first node N1, the second node N2, and the output terminal 20 can be completely discharged. Hence, the stability of the scan driver may be improved.

An embodiment of the invention maintains the transistors of the node controller 24 in the turn-on state for a longer period of time than other transistors of the shift register 140 in the process of the power-off sequence.

An example of a method for increasing a duration of the turn-on state of the transistors in the node controller 24 may be accomplished through maintaining the voltage of the control signal supply line for a longer period of time than other signal lines. In other words, after the supply of the gate high voltage VGH to the signal lines other than the control signal supply line is stopped, the voltage of the control signal supply line may be maintained at a high potential voltage for a predetermined period of time. Hence, the transistors included in the node controller 24 may maintain the turn-on state. In an embodiment disclosed herein, the high potential voltage may be the gate high voltage VGH or a voltage greater than the gate high voltage VGH.

Another example of a method for increasing the duration of the turn-on state of the transistors included in the node controller 24 may include increasing a natural discharge time of the control signal supply line by properly adjusting a time constant of the control signal supply line to maintain the transistors of the node controller 24 in the turn-on state for a longer period of time than other transistors. Other methods may be used to increase the duration of the turn-on state of the transistors of the node controller 24 and discharge the remaining charge on the nodes connected to the transistors of the node controller 24.

Figure 10:
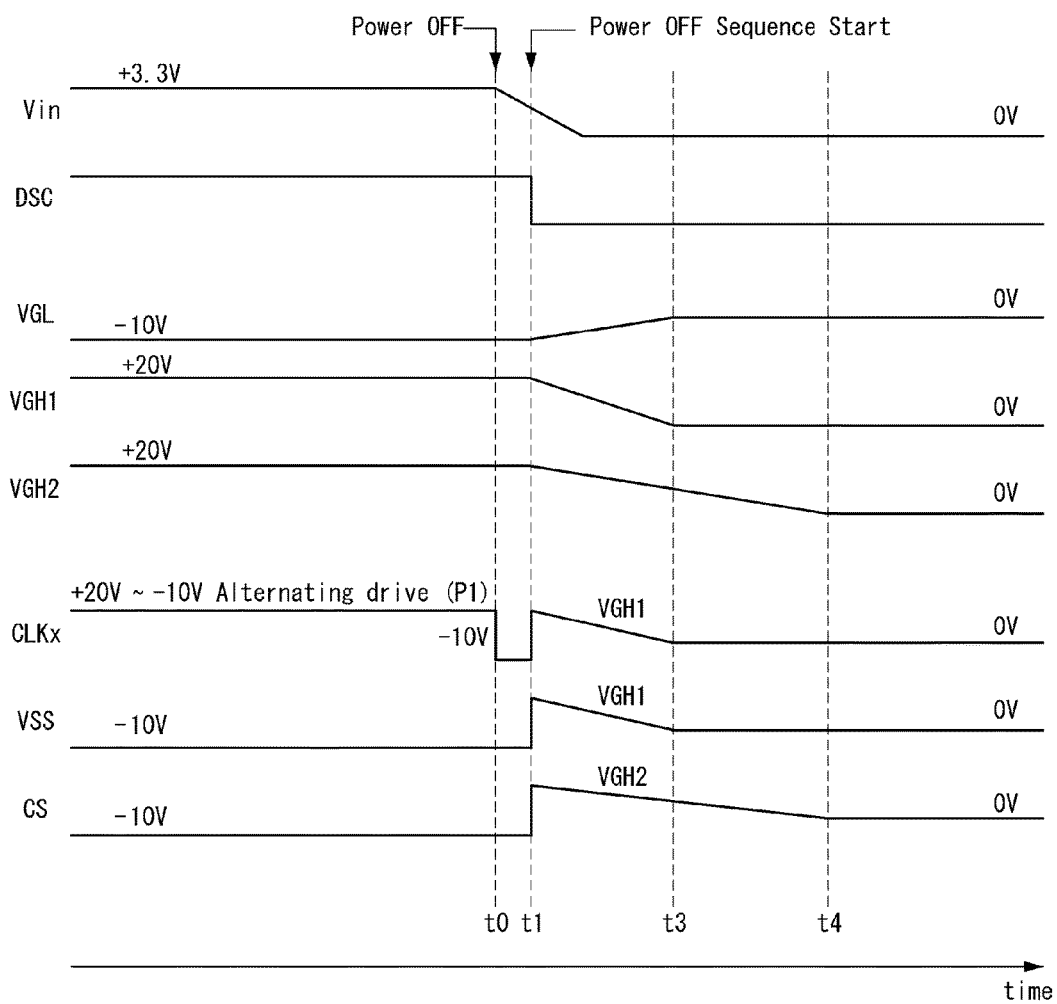
FIG. 10 is a waveform diagram showing a power-off sequence according to one aspect of the present disclosure.

FIG. 10 depicts a waveform diagram illustrating the power-off sequence according to an embodiment of the invention.

As depicted in FIG. 10, the power unit 150 may sense changes in the input voltage Vin and starts the power-off sequence when the input voltage Vin falls to a value equal to or less than a predetermined reference voltage. The power unit 150 may start to reduce the input voltage Vin at a power-off time t0 and may invert a voltage of a discharge control signal DSC to a low logic voltage at a time t1 when the input voltage Vin reaches the reference voltage.

When the voltage of the discharge control signal DSC is inverted to the low logic voltage, the gate low voltage VGL and first and second gate high voltages VGH1 and VGH2 may be discharged to the ground level voltage of 0V. A time constant of a first output terminal, to which the second gate high voltage VGH2 is output among VGH output terminals of the power unit 150, may be greater than a time constant of a second output terminal, to which the first gate high voltage VGH1 is output. The time constant may be adjusted through a resistance connected to the output terminal and a capacitance of a capacitor. As a result, the first and second gate high voltages VGH1 and VGH2 may start to be simultaneously discharged at the time t1 in response to the discharge control signal DSC. In this example, the first gate high voltage VGH1 reaches 0V at a time t3, and the second gate high voltage VGH2 reaches 0V at a time t4.

A clock CLKx swings between the first gate high voltage VGH1 and the gate low voltage VGL during the first period P1. The clock CLKx corresponds to the clocks CLK1 to CLK4, as depicted in FIGS. 3 to 5, for controlling a shift timing of the shift register 140. A clock voltage is reduced to −10V when Vin is lowered in the power IC chip. At the power-off time t0, the clock CLKx falls to the gate low voltage VGL at the time t0 and then rises to the first gate high voltage VGH1 at the time t1. The clock CLKx is discharged in response to the first gate high voltage VGH1 discharged after the time t1 and reaches 0V at the time t3. A negative DC power VSS maintains a negative DC voltage, for example, −10V until the time t1 and rises to the first gate high voltage VGH1 at the time t1. Then, the negative DC power VSS is discharged and reaches 0V at the time t3.

The control signal CS controlling the node controller 24 may be configured to maintain the gate low voltage VGL during the first period P1 and may be inverted to the second gate high voltage VGH2 during the second period P2. In the power-off sequence, after the voltage of the control signal CS rises to the second gate high voltage VGH2 at the time t1, the voltage of the control signal CS reaches 0V at the time t4 because of the delay of the discharge of the control signal CS. Thus, this embodiment of the invention may further increase a duration of the turn-on state of the transistors included in the node controller 24 in the power-off sequence. Alternate methods other than the above method may be used to increase the duration of the turn-on state of the transistors included in the node controller 24 and discharge remaining charge on the nodes connected to the transistors.

Figure 11:
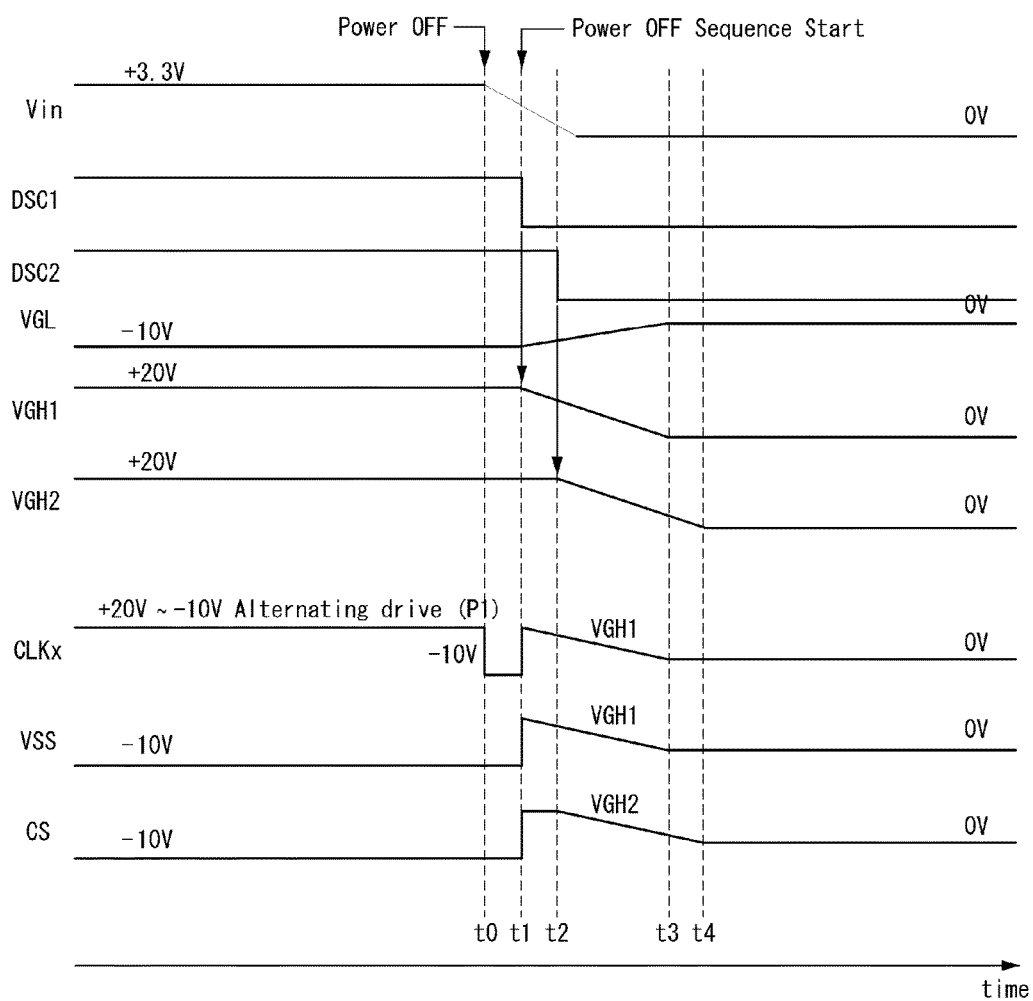
FIG. 11 is a waveform diagram showing a power-off sequence according to another aspect of the present disclosure.

FIG. 11 depicts a waveform diagram illustrating a power-off sequence according to another embodiment of the invention.

As depicted in FIG. 11, the power unit 150 may sense changes in the input voltage Vin and may start a power-off sequence when the input voltage Vin falls to a value equal to or less than a predetermined first reference voltage. The power unit 150 may start to reduce the input voltage Vin at a power-off time t0 and may invert a voltage of a first discharge control signal DSC1 to a low logic voltage at a time t1 when the input voltage Vin reaches the first reference voltage. Subsequently, the power unit 150 may delay the first discharge control signal DSC1 and inverts a voltage of a second discharge control signal DSC2 to the low logic voltage at a time t2.

The gate low voltage VGL and a first gate high voltage VGH1 may start to be discharged at the time t1 in response to the first discharge control signal DSC1. A second gate high voltage VGH2 may start to be discharged at the time t2 in response to the second discharge control signal DSC2. As a result, because the second gate high voltage VGH2 starts to be discharged later than the first gate high voltage VGH1, the first gate high voltage VGH1 reaches 0V at a time t3 and the second gate high voltage VGH2 reaches 0V at a time t4.

A clock CLKx swings between the first gate high voltage VGH1 and the gate low voltage VGL during the first period P1. In the power-off sequence, the clock CLKx falls to the gate low voltage VGL at the time t0 and then rises to the first gate high voltage VGH1 at the time t1. The clock CLKx is discharged in response to the first gate high voltage VGH1 discharged after the time t1 and reaches 0V at the time t3. A negative DC power VSS maintains a negative DC voltage, for example, −10V until the time t1 and rises to the first gate high voltage VGH1 at the time t1. Then, the negative DC power VSS is discharged and reaches 0V at the time t3.

The control signal CS controlling the node controller 24 may be configured to maintain the gate low voltage VGL during the first period P1 and may be inverted to the second gate high voltage VGH2 during the second period P2. In the power-off sequence, after the voltage of the control signal CS rises to the second gate high voltage VGH2 at the time t1, the voltage of the control signal CS reaches 0V at the time t4 because of the delay of the discharge of the control signal CS. Thus, this embodiment of the invention may further increase a duration of the turn-on state of the transistors included in the node controller 24 in the power-off sequence.

Figure 12:
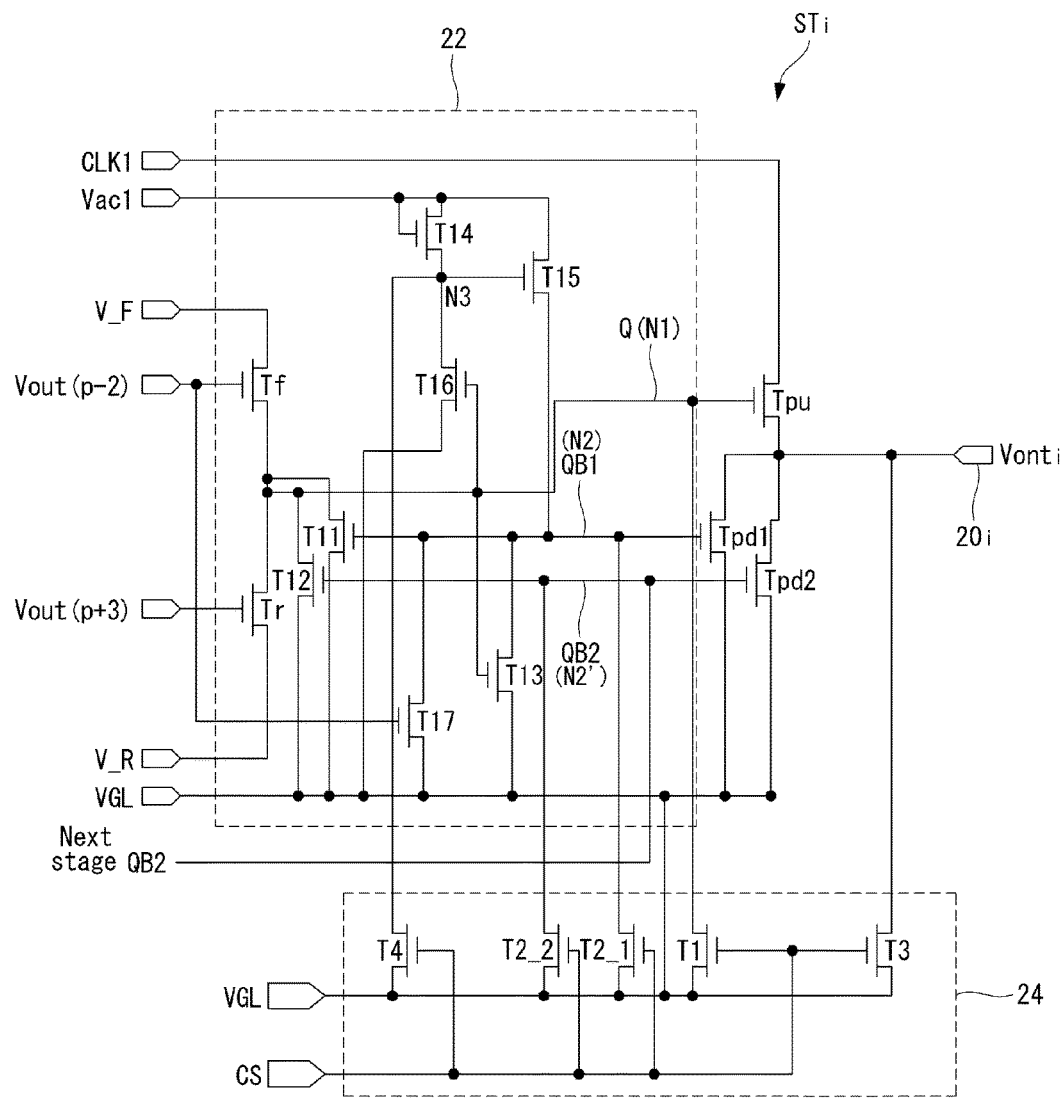
FIG. 12 is a circuit diagram showing an example of a circuit configuration of a stage shown in FIG. 4.

FIG. 12 depicts a circuit diagram illustrating an example of a circuit configuration of the stage depicted in FIG. 4. This embodiment of the invention is not limited to the circuit configuration of the stage depicted in FIG. 12. For example, the stage according to this embodiment of the invention may have any known alternative circuit configurations.

As depicted in FIG. 12, the driver 22 may include one pull-up transistor Tpu and two pull-down transistors Tpd1 and Tpd2.

A second transistor T2_1 of the node controller 24 may be connected between a QB1 node (e.g., a second node N2) and a low potential power line, and another second transistor T2_2 of the node controller 24 may be connected between a QB2 node (e.g., another second node N2') and the low potential power line.

The driver 22 may include a forward transistor Tf, a reverse transistor Tr, and eleventh to seventeenth transistors T11 to T17. The forward transistor Tf may be turned on due to a scan pulse of a previous stage. The reverse transistor Tr may be turned on due to a scan pulse of a next stage. A voltage of a forward voltage source V_F may be set to the gate high voltage VGH of a gate high voltage source VDD, and a voltage of a reverse voltage source V_R may be set to the gate low voltage VGL of a gate low voltage source VSS.

A first AC voltage Vac1 may be generated as an AC voltage swinging between the gate high voltage VGH and the gate low voltage VGL, but is not limited thereto. A polarity of the first AC voltage Vac1 is inverted in each frame. Since a configuration and a driving method of the driver 22 are known, a process for supplying the scan pulse is described.

When the driver 22 is forward driven, a start signal Vst or the scan pulse of the previous stage may be supplied to Vout(P−2), and the forward transistor Tf and the seventeenth transistor T17 may be turned on. When the forward transistor Tf is turned on, the voltage of the forward voltage source V_F may be supplied to a Q node. When the seventeenth transistor T17 is turned on, the gate low voltage VGL may be supplied to a QB1 node.

When the voltage of the forward voltage source V_F is supplied to the Q node, the pull-up transistor Tpu, the thirteenth transistor T13, and the sixteenth transistor T16 may be turned on.

When the thirteenth transistor T13 and the seventeenth transistor T17 are turned on, the gate low voltage VGL of the gate low voltage source VSS may be supplied to the QB1 node. Hence, the first pull-down transistor Tpd1 and the eleventh transistor T11 may be turned off. In addition, the second pull-down transistor Tpd2 may maintain the turn-off state due to a QB2 node (not shown) of the next stage.

When the sixteenth transistor T16 is turned on, the gate low voltage VGL may be supplied to a third node N3. In this instance, because the first AC voltage Vac1 is set to a positive voltage, the fourteenth transistor T14 may be turned on. Thus, the gate low voltage VGL and the first AC voltage Vac1 may be simultaneously supplied to the third node N3 during a turn-on period of the sixteenth transistor T16.

In an embodiment disclosed herein, the sixteenth transistor T16 may be formed larger than the fourteenth transistor T14 in terms of size. Hence, the third node N3 may maintain the gate low voltage VGL. When the third node N3 is set to the gate low voltage VGL, the fifteenth transistor T15 is turned off.

When the pull-up transistor Tpu is turned on, the output terminal 20 receives the first clock CLK1. The pull-up transistor Tpu may supply a high level voltage (e.g., the gate high voltage VGH of the gate high voltage source VDD) of the first clock CLK1, as the scan pulse, to the output terminal 20 during a turn-on period of the pull-up transistor Tpu.

Afterwards, the scan pulse of the next stage may be supplied to Vout(P+3), and thus the reverse transistor Tr may be turned on. When the reverse transistor Tr is turned on, the voltage of the reverse voltage source V_R may be supplied to the Q node. When the voltage of the reverse voltage source V_R is supplied to the Q node, the pull-up transistor Tpu, the thirteenth transistor T13, and the sixteenth transistor T16 are turned off.

In this instance, because the first AC voltage Vac1 is set to a positive voltage, the fourteenth transistor T14 is turned on. Hence, the voltage of the third node N3 is set to a high level voltage. When the voltage of the third node N3 is set to the high level voltage, the fifteenth transistor T15 is turned on.

When the fifteenth transistor T15 is turned on, the positive first AC voltage Vac1 is supplied to the QB1 node. When the positive first AC voltage Vac1 is supplied to the QB1 node, the first pull-down transistor Tpd1 and the eleventh transistor T11 are turned on.

When the eleventh transistor T11 is turned on, the gate low voltage VGL is supplied to the Q node. When the first pull-down transistor Tpd1 is turned on, the gate low voltage VGL of the gate low voltage source VSS is supplied to the output terminal 20. Afterwards, each stage may repeatedly perform the above-described processes and supply the scan pulse to the scan line.

The Q node controlling the pull-up transistor Tpu, the QB node controlling the two pull-down transistors Tpd1 and Tpd2, and the transistors T1 to T3 of the node controller 24 for discharging any remaining charge on the output terminal 20 may all be connected.

In addition, the driver 22 may have a node not connected to the external signal lines. For example, in the driver 22 depicted in FIG. 12, the third node N3 is not directly connected to the external signal lines and may be temporarily in a floating state depending on the driving method. The node controller 24 may further include a transistor (for example, a fourth transistor T4) connected between the node, which may be in the floating state depending on an operation of the driver 22, and the gate low voltage source VSS. The number of additional transistors the node controller 24 includes is not limited, and may vary depending on the number of nodes of the driver 22 that may be in the floating state.

The fourth transistor T4 may be configured to be turned on and off in response to the control signal CS in the same manner as the operations of the transistors T1 to T3 of the node controller 24 that are connected to the Q node, the QB node, and the output terminal. In other words, during the second period P2, wherein the scan pulse is not supplied, the fourth transistor T4 is turned on, and the gate low voltage VGL is supplied to the fourth transistor T4. Hence, the fourth transistor T4 is driven so that the third node N3 is not in the floating state. In addition, the fourth transistor T4 may discharge any remaining charge from the third node N3 not directly connected to the external signal lines in the process of the power-off sequence. Since the operation process of the node controller 24 is described above, a further description thereof is omitted.

As described above, the embodiment of the invention is configured so that each stage of the scan driver includes the node controller. The node controller controls the node of the floating state in a specific state and can stabilize the voltage of the scan line irrespective of noise.

Furthermore, this embodiment of the invention may turn off the pull-up transistor and the pull-down transistor for a predetermined period of time using the node controller and thus may improve the lifespan and the reliability of the transistors. The embodiment of the invention may remove any remaining charge using the node controller when the supply of the power is stopped, thereby improving the lifespan of the transistors.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
   a display panel comprising a plurality of scan lines;
   a timing controller; and
   a scan driver comprising a plurality of scan stages configured to generate a scan pulse for each of the plurality of scan lines, each of the plurality of scan stages comprising:
      a pull-up transistor and a pull-down transistor coupled in series and defining an output node for a corresponding one of the plurality scan lines;
      a driver configured to generate driver control signals at a first gate electrode for the pull-up transistor and at a second gate electrode for the pull-down transistor during a first time period; and
      a node controller configured to:
         decouple a reference voltage node to the first gate electrode, the second gate electrode, and the output node according to a control signal from the timing controller during the first time period; and
         couple the reference voltage node to the first gate electrode, the second gate electrode, and the output node according to the control signal during a second time period,
      wherein the first time period comprises a scan period in which the scan pulse is supplied to each of the scan lines,
      wherein the second time period comprises a blank time in which the scan pulse is not supplied between respective frame periods displaying the image on the display panel, and
      wherein the blank time is varied according to an amount of motion in an input image data of the display device.

2. The display device of claim 1, wherein:
   the control signal from the timing controller is configured to turn off devices in the node controller during the first time period to provide the decoupling; and
   the control signal from the timing controller is further configured to turn on the devices during the second time period to provide the coupling.

3. The display device of claim 2, wherein the devices are configured, during the second time period, to discharge the first gate electrode, the second gate electrode, and the output node with a delay.

4. The display device of claim 2, wherein:
   the control signal from the timing controller is inverted to a voltage for turning on the one or more transistors at a start of the second time period, and
   the voltage is between a gate low voltage and a gate high voltage.

5. The display device of claim 2, wherein the devices in the node controller comprise:
   a first transistor connected in series between the first gate electrode and a reference voltage node;
   a second transistor connected in series between the second gate electrode and the reference voltage node; and
   a third transistor connected in series between the output node and the reference voltage node,
   wherein gate electrodes of the first, the second, and the third transistors are configured to receive the control signal from the timing controller.

6. The display device of claim 5, wherein the devices in the node controller further comprise:
   at least one fourth transistor connected in series between a portion of the driver and the reference voltage node,
   wherein the gate electrode of the at least one fourth transistor is configured to receive the control signal from the timing controller.

7. A method of operating a display device, the method comprising:
   generating, at a timing controller, a control signal for a node controller configured to selectively couple and decouple a reference voltage node to a first gate electrode of a pull-up transistor of a scan driver stage, a second gate electrode of a pull-down transistor of the scan driver stage, and an output node of the scan driver stage, the generating comprising:
      during a first time period, configuring the control signal to decouple the reference voltage node from the first gate electrode, the second gate electrode, and the output node, and
      during a second time period after the first time period, configuring the control signal to couple the reference voltage node to the first gate electrode, the second gate electrode, and the output node,
   wherein the first time period comprises a scan period in which a scan pulse is supplied to each of the scan lines,
   wherein the second time period comprises:
      a blank time in which the scan pulse is not supplied between respective frame periods displaying the image on the display panel, and
      a power-off sequence of the display device, and
   wherein the blank time is varied according to an amount of motion in an input image data of the display device.

8. The method of claim 7, wherein:
   the node controller comprises one or more transistors connecting the reference voltage node to each of the first gate electrode, the second gate electrode, and the output node; and
   the configuring during the second time period comprises:
      during a first portion of the power-off sequence, inverting the control signal to a voltage for turning on the one or more transistors, the voltage being between a gate low voltage and a gate high voltage, and
      during a second portion of the power-off sequence, discharging the voltage for turning off the one or more transistors to a reference voltage with a delay.

9. The method of claim 8, wherein the discharging is completed prior to an end of the power-off sequence.

10. The method of claim 7, further comprising:
detecting a change in an input voltage to the display device;
inverting a discharge signal to a low logic voltage in response to the detecting to start the power-off sequence;
determining that the discharge signal is at the low logic voltage; and
in response to the determining that the discharge signal is at the low logic voltage, discharging a plurality of voltage supply lines for the scan driver stage during the power-off sequence.

11. The method of claim 10, wherein:
the plurality of supply voltage lines comprise two or more high voltage supply lines; and
the discharging comprises discharging the two or more high voltage supply lines at different rates during the power-off sequence.

12. The method of claim 7, further comprising:
setting, during the first time period, a clock signal to the low logic voltage;
setting the clock signal to a high logic voltage at a start of the power-off sequence; and
discharging the clock signal to a reference voltage during the power-off sequence.

13. The method of claim 7, further comprising:
setting a reference voltage node to a high logic at a start of the power-off sequence; and
discharging the reference voltage node to the reference voltage during the power-off sequence.

14. A display device, comprising:
a shift register including a plurality of stages configured to shift and to output a scan pulse for a plurality of scan lines, each of the plurality of stages comprising:
a pull-up transistor and a pull-down transistor coupled in series and defining an output node therebetween;
a driver comprising:
a first node coupled to a gate electrode of the pull-up transistor; and
a second node coupled to a gate electrode of the pull-down transistor; and
a node controller coupled to the first node, the second node, and the output node,
wherein the pull-up transistor is configured to supply a high voltage at the output node in response to the driver supplying a turn-on voltage at the first node,
wherein the pull-down transistor is configured to supply a low voltage at the output node in response to the driver supplying a turn-on voltage at the second node,
wherein the node controller is configured to:
decouple a reference voltage node to the first gate electrode, the second gate electrode, and the output node according to a control signal during the first time period, and
couple the reference voltage node to the first gate electrode, the second gate electrode, and the output node according to the control signal during a second time period,
wherein the first time period comprises a scan period in which the scan pulse is supplied to each of the scan lines,
wherein the second time period comprises:
a blank time in which the scan pulse is not supplied between respective frame periods displaying the image on the display panel, and
a power-off sequence of the display device, and
wherein the blank time is varied according to an amount of motion in an input image data of the display device.

15. The display device of claim 14, wherein the node controller comprises:
a first transistor connected between the first node and a reference voltage source;
a second transistor connected between the second node and the reference voltage source; and
a third transistor connected between the output terminal and the reference voltage source.

16. The display device of claim 15, wherein the turn-on voltage is between a high logic voltage and the low logic voltage and is greater than a threshold voltage of each of the first, the second, and the third transistors.

17. The display device of claim 15, wherein the node controller further comprises at least one fourth transistor connected in series between an internal node of the driver and the reference voltage source.

18. The display device of claim 14, further comprising:
a timing controller for generating the control signal,
wherein a voltage of the control signal is between a gate low voltage and a gate high voltage.

19. The display device of claim 18, wherein the timing controller is configured to generate the control signal to have a delay during the power-off sequence.

* * * * *